(12) United States Patent
Kon

(10) Patent No.: US 8,421,662 B2
(45) Date of Patent: Apr. 16, 2013

(54) DA CONVERTER

(75) Inventor: Masumi Kon, Yokohama (JP)

(73) Assignee: Renesas Electronics Corporation, Kanagawa (JP)

( * ) Notice: Subject to any disclaimer, the term of this patent is extended or adjusted under 35 U.S.C. 154(b) by 94 days.

(21) Appl. No.: 13/195,556

(22) Filed: Aug. 1, 2011

(65) Prior Publication Data

US 2012/0050085 A1 Mar. 1, 2012

(30) Foreign Application Priority Data

Aug. 30, 2010 (JP) ................................. 2010-192647

(51) Int. Cl.
 *H03M 1/68* (2006.01)
 *H03M 1/78* (2006.01)

(52) U.S. Cl.
 USPC .......................................... 341/145; 341/154

(58) Field of Classification Search .................. 341/145, 341/153, 154
See application file for complete search history.

(56) References Cited

U.S. PATENT DOCUMENTS

| | | | | |
|---|---|---|---|---|
| 4,292,625 | A * | 9/1981 | Schoeff | 341/145 |
| 6,252,534 | B1 * | 6/2001 | Timko | 341/154 |
| 7,042,381 | B1 * | 5/2006 | Pan | 341/154 |
| 8,330,634 | B2 * | 12/2012 | Li et al. | 341/154 |
| 2003/0001766 | A1 * | 1/2003 | Song | 341/145 |

FOREIGN PATENT DOCUMENTS

JP 62-005729 A 1/1987

* cited by examiner

*Primary Examiner* — Howard Williams
(74) *Attorney, Agent, or Firm* — Sughrue Mion, PLLC

(57) ABSTRACT

A low power consumption DA converter includes a segment type DA converter and an R-2R resistance ladder DA converter. The segment type DA converter is coupled to a power source voltage VDD and outputs a current signal changing in a stepwise manner according to inputted upper bits D[7 to 5]. The R-2R resistance ladder DA converter is coupled to the segment type DA converter in series between the power source voltage VDD and a ground voltage GND, and outputs an output voltage Vout changing in a stepwise manner. The R-2R resistance ladder DA converter changes the output voltage Vout by raising or lowering a reference voltage Vref according to the lower bits D[4 to 0] and the current signal from the segment type DA converter.

19 Claims, 10 Drawing Sheets

FIG. 8

| D7 | D [6:5] | OPERATION OF SELECTOR 8 | OPERATION OF SELECTOR 9 | DECODED OUTPUT OF SEGMENT DECODER UNIT 2b | OPERATION OF CONSTANT CURRENT CELL 3d | OPERATION OF CONSTANT CURRENT CELL 5b |
|---|---|---|---|---|---|---|
| 0 | 00 | OUTPUT THE OUTPUT DATA OF SEGMENT DECODER 2b | OUTPUT THE OUTPUT DATA OF R-2R DRIVER 4 | 00011 | TWO CONSTANT CURRENT SOURCES Ia1 AND Ia2 ARE ON | CONTROL CONSTANT CURRENT SOURCE BY THE LEAST SIGNIFICANT 5 BITS |
| 0 | 01 | | | 00111 | THREE CONSTANT CURRENT SOURCES Ia1 TO Ia3 ARE ON | |
| 0 | 10 | | | 01111 | FOUR CONSTANT CURRENT SOURCES Ia1 TO Ia4 ARE ON | |
| 0 | 11 | | | 11111 | FIVE CONSTANT CURRENT SOURCES Ia1 TO Ia5 ARE ON | |
| 1 | 00 | OUTPUT THE OUTPUT DATA OF R-2R DRIVER 4 | OUTPUT THE OUTPUT DATA OF SEGMENT DECODER 2b | 11111 | CONTROL CONSTANT CURRENT SOURCE BY THE LEAST SIGNIFICANT 5 BITS | FIVE CONSTANT CURRENT SOURCES Ib1 TO Ib5 ARE ON |
| 1 | 01 | | | 01111 | | FOUR CONSTANT CURRENT SOURCES Ib1 TO Ib4 ARE ON |
| 1 | 10 | | | 00111 | | THREE CONSTANT CURRENT SOURCES Ib1 TO Ib3 ARE ON |
| 1 | 11 | | | 00011 | | TWO CONSTANT CURRENT SOURCES Ib1 AND Ib2 ARE ON |

DA CONVERTER

CROSS-REFERENCES TO RELATED APPLICATIONS

The disclosure of Japanese Patent Application No. 2010-192647 filed on Aug. 30, 2010 including the specification, drawings and abstract is incorporated herein by reference in its entirety.

BACKGROUND

The present invention relates to a DA converter, and in particular to a low power consumption DA converter.

As high performance and low power consumption of large scale integration (LSI) are required, high performance (reduction in the amount of glitches) and low current consumption of DA converter are increasingly required. Generally, a current summing DA converter (for example, Japanese Unexamined Patent Application Publication No. Sho 62 (1987)-5729) is used as a DA converter in which the amount of glitches is reduced. However, an ordinary current summing DA converter has a problem that the current consumption is large. Therefore, a DA converter that can reduce current consumption is desired to be developed.

An example of the current summing DA converter as mentioned above will be described. FIG. 10 is a circuit block diagram showing a configuration of an eclectic DA converter 900 in which a current summing DA converter is mounted. As shown in FIG. 10, the eclectic DA converter 900 includes a driver unit 91, a segment decoder unit 92, an R-2R driver unit 93, a segment type (current summing) DA converter 94, and an R-2R resistance ladder DA converter 95. The eclectic DA converter 900 processes the upper m bits of inputted (m+n) bits (m and n are integers of 2 or more) by the segment type (current summing) DA converter 94 and processes the lower n bits by the R-2R resistance ladder DA converter 95. The upper m bits are inputted into the segment decoder unit 92 via the driver unit 91. The lower n bits are inputted into the R-2R resistance ladder DA converter 95 via the R-2R driver unit 93.

The segment decoder unit 92 has $(2^m-1)$ decoders (not shown in FIG. 10). Thereby, a digital signal of the upper m bits inputted into the segment decoder unit 92 is decoded into a signal of $(2^m-1)$ bits. The segment type DA converter 94A has $(2^m-1)$ current sources and current switches. The $(2^m-1)$ current sources (current value $I_0$) and current switches are switched to an off state or an on state according to the signal of $(2^m-1)$ bits outputted from the segment decoder unit 92. Thereby, the digital signal of the upper m bits is converted into an analog amount in a range from 0 [V] to $-(2^m-1) \times I_0 \times (\frac{2}{3}) \times R$ [V].

The R-2R resistance ladder DA converter 95 has n current sources (current value $I_0$) and current switches, and a resistance ladder. The resistance ladder includes resistances R (resistance value is R) and resistances 2R (resistance value is 2R). Each of the n current sources and current switches is switched to an off state or an on state according to one bit of a lower n-bit signal. Thereby, the lower n-bit signal is converted into an analog amount in a range from 0 [V] to $-(1-(\frac{1}{2}^n)) \times I_0 \times (\frac{2}{3}) \times R$ [V] by the resistance ladder.

An analog output corresponding to a digital signal of (m+n) bits inputted into the eclectic DA converter 900 has an analog amount obtained by summing up the analog amounts generated by the segment type DA converter 94 and the R-2R resistance ladder DA converter 95.

SUMMARY

However, inventors found that the aforementioned DA convertor causes a problem as described below. The aforementioned eclectic DA convertor 900 sums up currents flowing in the segment type DA converter 94 and the R-2R resistance ladder DA converter 95, and converts the summed-up result into a voltage. Therefore, an eclectic DA convertor such as the eclectic DA convertor 900 causes a problem that current consumption increases.

A DA converter according to an aspect of the present invention includes: a first DA conversion unit that is coupled to a first voltage source and outputs a current signal changing in a stepwise manner according to an inputted first digital signal; and a second DA conversion unit that is coupled to the first DA conversion unit in series between a second voltage source different from the first voltage source and the first voltage source and outputs a current signal changing in a stepwise manner, in which the second DA conversion unit changes the output voltage by raising or lowering a reference voltage supplied from a reference voltage source coupled to the second DA conversion unit according to an inputted second digital signal and the current signal. In this DA converter, the first DA conversion unit and the second DA conversion unit are coupled in series. Therefore, it is possible to reduce current flowing in the DA converter compared with a case in which the first DA conversion unit and the second DA conversion unit are coupled in parallel.

A DA converter according to another aspect of the present invention includes:

a first constant current cell unit including multiple first constant current sources;

a second constant current cell unit which is coupled to the first constant current cell unit in series via a first node and includes multiple second constant current sources, the number of which is the same as that of the first constant current sources; and a resistance circuit which is coupled between the first node and an output terminal and outputs an output voltage changing in a stepwise manner according to a flowing current and a voltage of the first node from the output terminal, in which, when the value of the most significant bit of an inputted digital signal is a first value, the first constant current cell unit changes an output current in a stepwise manner by controlling the number of the first constant current sources that output current according to q (q is an integer of 1 or more) bits excluding the most significant bit included in the digital signal, and the second constant current cell unit couples the second constant current sources to the first node either directly or via the resistance circuit according to r (r is an integer of 2 or more) bits excluding the most significant bit and the q bits included in the digital signal, when the value of the most significant bit is a second value different from the first value, the second constant current cell unit changes the output current in a stepwise manner by controlling the number of the second constant current sources that output current according to the q bits, and the first constant current cell unit couples the first constant current sources to the first node either directly or via the resistance circuit according to the r bits included in the digital signal, the voltage of the first node changes in a stepwise manner according to the change of the output current of the first constant current cell unit or the output current of the second constant current cell unit, and the resistance circuit changes the output voltage by raising or lowering the voltage of the first node according to a combination of the first constant current sources or the second constant current sources coupled to the resistance circuit. In this DA converter, the first constant current cell unit and the second constant current cell unit are coupled in series.

Therefore, it is possible to reduce current flowing in the DA converter compared with a case in which the first constant current cell unit and the second constant current cell unit are coupled in parallel.

According to the aspects of the present configuration, it is possible to provide a low power consumption DA converter.

BRIEF DESCRIPTION OF THE DRAWINGS

FIG. 8 is an operation table showing an operation of the DA converter according to the fourth embodiment;

DETAILED DESCRIPTION

Figure 1:
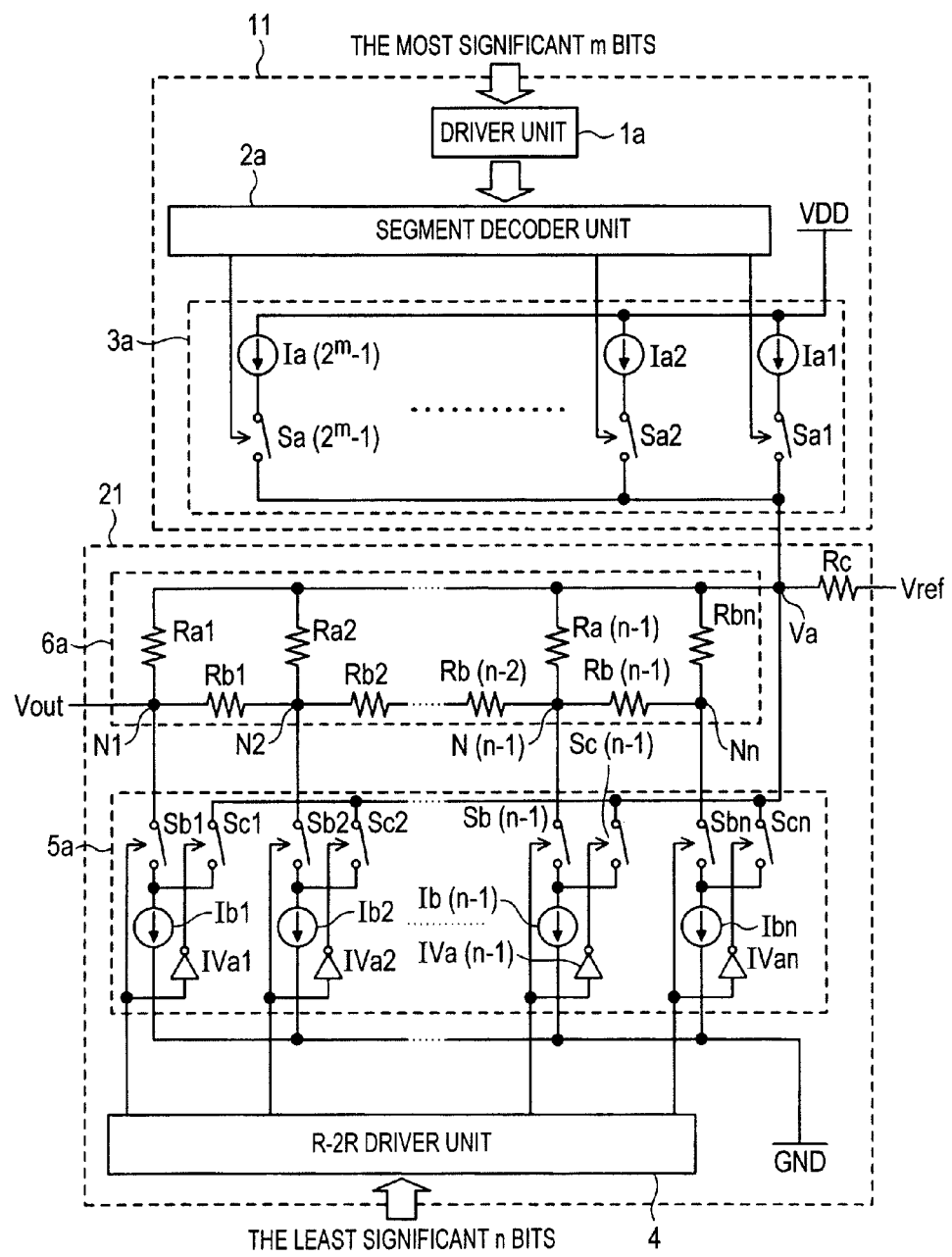
FIG. 1 is a circuit block diagram showing a configuration of a DA converter according to a first embodiment.

Hereinafter, embodiments of the present invention will be described with reference to the drawings. In the drawings, the same elements are given the same reference numerals and repetitive descriptions will be omitted as necessary.

First Embodiment

First, a DA converter according to a first embodiment will be described. FIG. 1 is a circuit block diagram showing a configuration of a DA converter 100 according to the first embodiment. The DA converter 100 includes a segment type DA converter 11 and an R-2R resistance ladder DA converter 21. The segment type DA converter 11 and the R-2R resistance ladder DA converter 21 are coupled in series between a power source voltage VDD and a ground voltage GND. A digital signal of (m+n) bits is inputted into the DA converter 100. Here, n and m are integers larger than or equal to 2. The upper m bits of the digital signal of (m+n) bits are inputted into the segment type DA converter 11. The lower n bits of the digital signal of (m+n) bits are inputted into the R-2R resistance ladder DA converter 21.

The segment type DA converter 11 includes a driver unit 1a, a segment decoder unit 2a, and a constant current cell unit 3a. The upper m bits are inputted into the segment decoder unit 2a via the driver unit 1a. The segment decoder unit 2a decodes the upper m bits and outputs a generated decode signal. The constant current cell unit 3a includes $(2^m-1)$ constant current sources Ia1 to Ia($2^m-1$) and $(2^m-1)$ switches Sa1 to Sa($2^m-1$). A constant current source Iak (k is an integer satisfying $1 \leq k \leq 2^m-1$) and a switch Sak are coupled in series between the power source voltage VDD and the R-2R resistance ladder DA converter 21 (node Va of the R-2R resistance ladder DA converter 21). A corresponding decode signal from the segment decoder unit 2a is inputted into the control terminal of the switch Sak.

The R-2R resistance ladder DA converter 21 includes an R-2R driver unit 4, a constant current cell unit 5a, an R-2R resistance ladder 6a, and a resistance Rc. The node Va of the R-2R resistance ladder DA converter 21 is coupled to the segment type DA converter 11. The lower n bits are inputted into the constant current cell unit 5a via the R-2R driver unit 4. The constant current cell unit 5a includes n constant current sources Ib1 to Ibn, n switches Sb1 to Sbn, n switches Sc1 to Scn, and n inverters IVa1 to IVan. The positive terminal of a constant current source Ibj (j is an integer satisfying $1 \leq j \leq n$) is coupled to a node Nj of the R-2R resistance ladder 6a described below via a switch Sbj. The negative terminal of the constant current source Ibj is coupled to the ground voltage GND. A corresponding lower bit is inputted into the control terminal of the switch Sbj. The switch Scj is coupled between the positive terminal of the constant current source Ibj and the node Va. An inverted signal of a corresponding lower bit is inputted into the control terminal of the switch Scj via the inverter IVaj.

The R-2R resistance ladder 6a includes resistances Ra1 to Ra(n–1) and resistances Rb1 to Rbn. Here, the resistance value of the resistances Ra1 to Ra(n–1) is 2R. The resistance value of the resistances Rb1 to Rbn is R. An output voltage Vout is outputted from the output terminal of the R-2R resistance ladder 6a. The resistances Rb1 to Rbn are coupled in series between the node Va and the output terminal. Terminals on the output terminal sides of the resistances Rb1 to Rbn are respectively defined as nodes N1 to Nn. The resistances Ra1 to Ra(n–1) are respectively coupled between the nodes N1 to N(n–1) and the node Va. Therefore, a combined resistance value between the node Va and the output terminal of the R-2R resistance ladder 6a is R. The resistance Rc is coupled between the node Va of the R-2R resistance ladder 6a and a reference voltage source that generates a reference voltage Vref. The resistance value of the resistance Rc is R.

The current value of the constant current sources Ia1 to Ia($2^m-1$) of the segment type DA converter 11 and the current value of the constant current sources Ib1 to Ibn of the R-2R resistance ladder DA converter 21 are I.

Next, an operation of the DA converter 100 will be described. When the voltage at the node Va is Va, the voltage Va is determined by a current value obtained by adding an output current $\beta I$ of the constant current cell unit 3a to an output current nI of the constant current cell unit 5a and the R-2R resistance ladder 6a. Here, $\beta$ is the number of the constant current sources that are turned on in the constant current cell unit 3a, and $\beta$ is an integer from 0 to $(2^m-1)$. In this case, the voltage Va is represented by the following formula (1):

$$Va = Vref + (\beta - n) \times I \times 2R \qquad (1)$$

The output voltage Vout outputted from the DA converter 100 is represented by the following formula (2):

$$Vout = Va - \frac{1}{2^n} \times \alpha \times I \times 2R \qquad (2)$$

Here, $\alpha$ is an integer from 0 to $2^n-1$.

Next, a current flow in the DA converter 100 will be described. The output current $\beta I$ of the constant current cell unit 3a flows into the node Va. The current value of the output current $\beta I$ varies in a range from 0 to $(2^m-1)I$ according to variation of data of the upper m bits. The output current nI of the constant current cell unit 5a and the R-2R resistance ladder 6a also flows into the node Va. The current value of the output current nI is always nI and constant. When the output current βI and the output current nI have the same value, an equilibrium state is generated, and no current flows in the resistance Rc.

When the output current βI is larger than the output current nI, a current having a current value (β−n)I flows from the node Va to the reference voltage Vref in the resistance Rc. On the other hand, when the output current βI is smaller than the output current nI, a current having a current value (n−β)I flows from the reference voltage Vref to the node Va in the resistance Rc. The maximum current that flows in the DA converter 100 is $(2^m-1)$I.

Here, a current flow in an eclectic DA converter 900 which handles (m+n) bits including the upper m bits and the lower n bits will be discussed. In this case, the maximum current that flows in a segment type DA converter 94 is $(2^m-1)$I. A current that flows in an R-2R resistance ladder DA converter 95 is nI. Therefore, the maximum current that flows in the eclectic DA converter 900 is $\{(2^m-1)+n\}$I.

Therefore, the DA converter 100 can reduce current consumption by nI compared with the eclectic DA converter 900. Thus, according to the present configuration, it is possible to provide a low power consumption DA converter.

Specifically, in the eclectic DA converter 900, the segment type DA converter 94 and the R-2R resistance ladder DA converter 95 are coupled in parallel. Further, the segment type DA converter 94 and the R-2R resistance ladder DA converter 95 include constant current sources coupled to the power source in the same polarity. Therefore, it is necessary to supply current respectively and separately to the segment type DA converter 94 and the R-2R resistance ladder DA converter 95.

On the other hand, in the DA converter 100 according to the present embodiment, the segment type DA converter 11 and the R-2R resistance ladder DA converter 21 are coupled in series. In other words, the constant current sources Ib1 to Ibn of the constant current cell unit 5a uses all or part of the current outputted from the constant current sources Ia1 to Ia($2^m-1$) of the constant current cell unit 3a. Thereby, the DA converter 100 can reduce consumption current compared with the eclectic DA converter 900.

Figure 2:
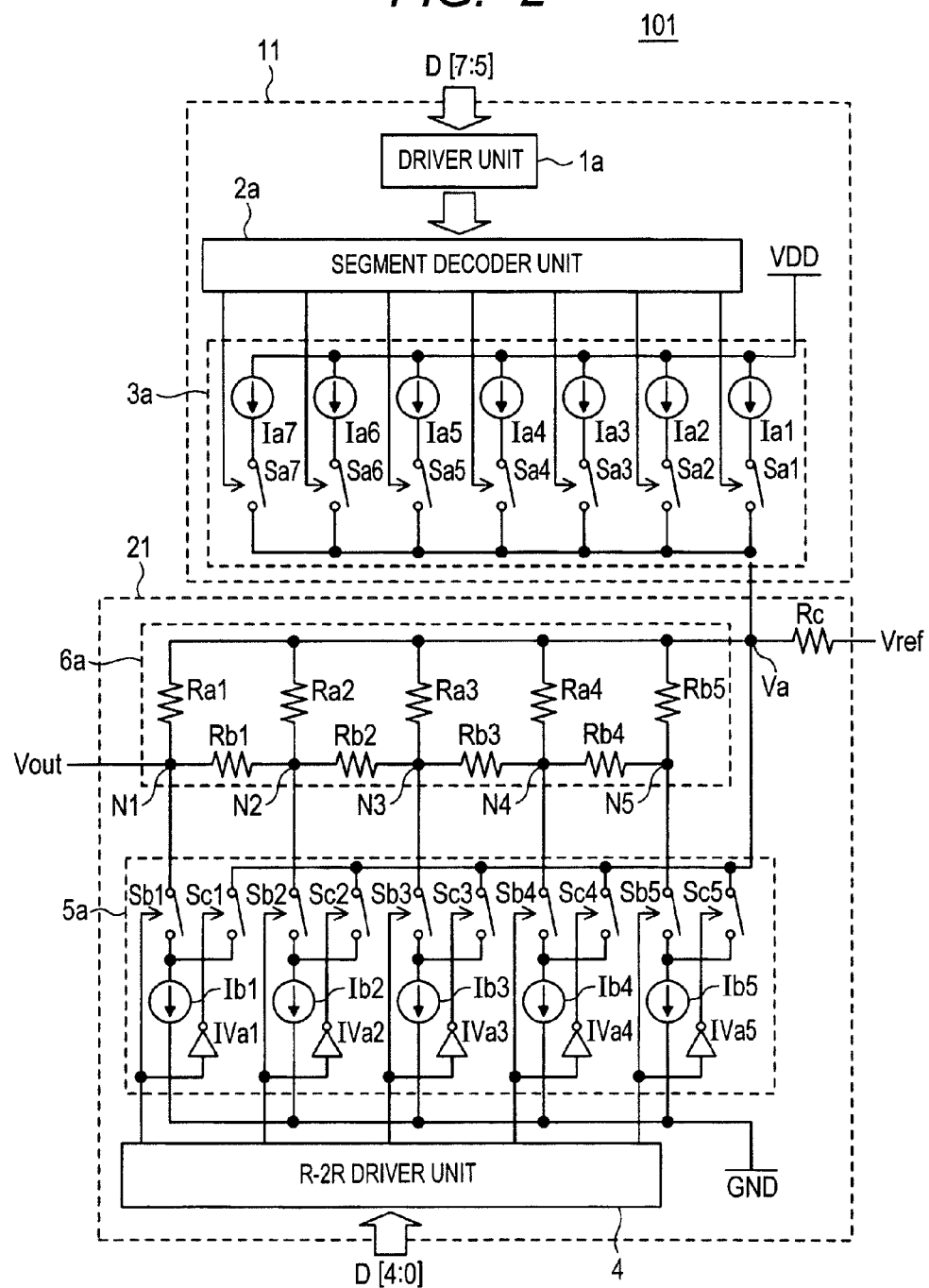
FIG. 2 is a circuit block diagram showing a configuration of a DA converter according to the first embodiment.

Next, as a specific example, a case in which the DA converter 100 is an 8-bit DA converter will be described. Hereinafter, the 8-bit DA converter 100 is referred to as a DA converter 101. FIG. 2 is a circuit block diagram showing a configuration of the DA converter 101. An 8-bit digital signal is divided into the upper 3 bits D[7 to 5] and the lower 5 bits D[4 to 0], and inputted into the DA converter 101. The constant current cell unit 3a is provided with 7($2^3-1$) constant current sources Ia1 to Ia7. The constant current cell unit 5a is provided with 5 constant current sources Ib1 to Ib5. The R-2R resistance ladder 6a includes resistances Ra1 to Ra4i and resistances Rb1 to Rb5.

Figure 3:
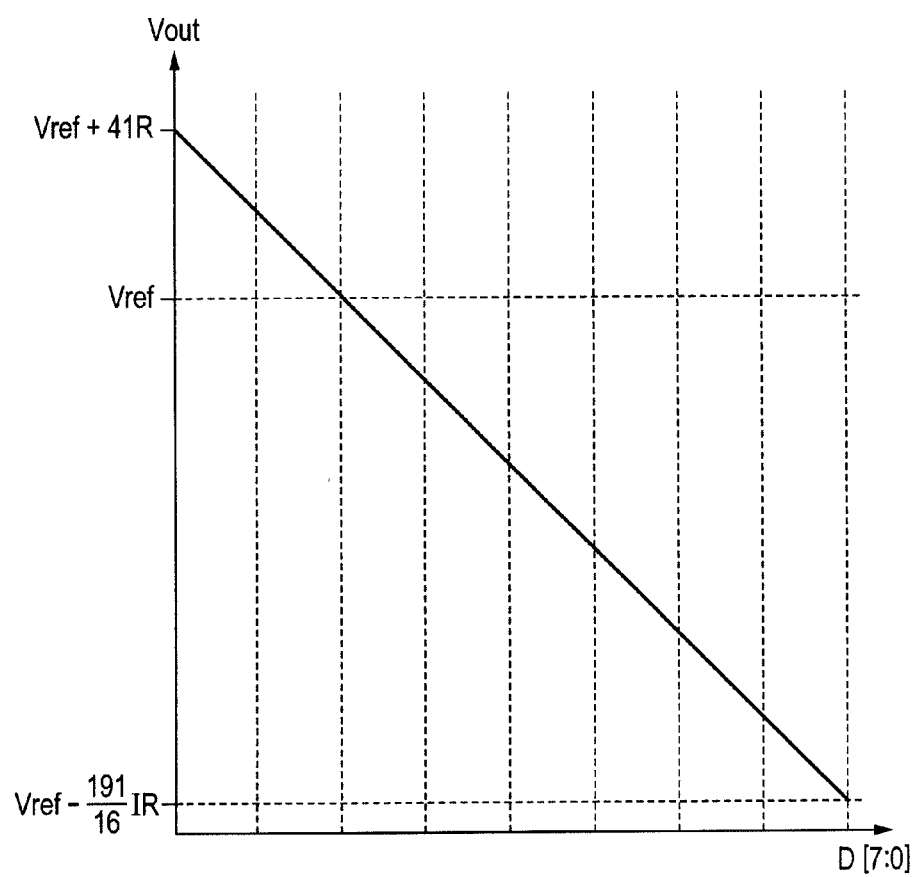
FIG. 3 is a graph showing an output voltage Vout of the DA converter according to the first embodiment.

FIG. 3 is a graph showing an output voltage Vout of the DA converter 101. In FIG. 3, the horizontal axis indicates 8-bit code and the vertical axis indicates the value of the output voltage Vout. The DA converter 101 outputs 256 steps (8 bits) of output voltages in a range shown by the following formula (3):

$$Vref - \frac{191}{16}IR \leq Vout \leq Vref + 4IR \quad (3)$$

Next, the current flow in the DA converter 101 will be described. The output current βI of the constant current cell unit 3a flows into the node Va. The current value of the output current βI varies in a range from 0 to 7I according to variation of data of the upper 3 bits. The output current nI of the constant current cell unit 5a and the R-2R resistance ladder 6a also flows into the node Va. The current value of the output current nI is always 5I and constant. When the output current βI and the output current nI have the same current value of 5I, an equilibrium state is generated, and no current flows in the resistance Rc.

When the output current βI is larger than the output current nI, a current having a current value up to (7−5)I=2I flows from the node Va to the reference voltage Vref in the resistance Rc. When the output current βI is smaller than the output current nI, a current having a current value up to (5−0)I=5I flows from the reference voltage Vref to the node Va in the resistance Rc. The maximum current that flows in the DA converter 101 is 7I.

Here, a current flow in the eclectic DA converter 900 which handles 8 bits including the upper 3 bits and the lower 5 bits will be discussed. In this case, the maximum current that flows in the segment type DA converter 94 is 7I. The current that flows in the R-2R resistance ladder DA converter 95 is 5I. Therefore, the maximum current that flows in the eclectic DA converter 900 is 12I.

Thus, it is possible to specifically confirm that the DA converter 101 can reduce current consumption by nI compared with the eclectic DA converter 900.

Second Embodiment

Figure 4:
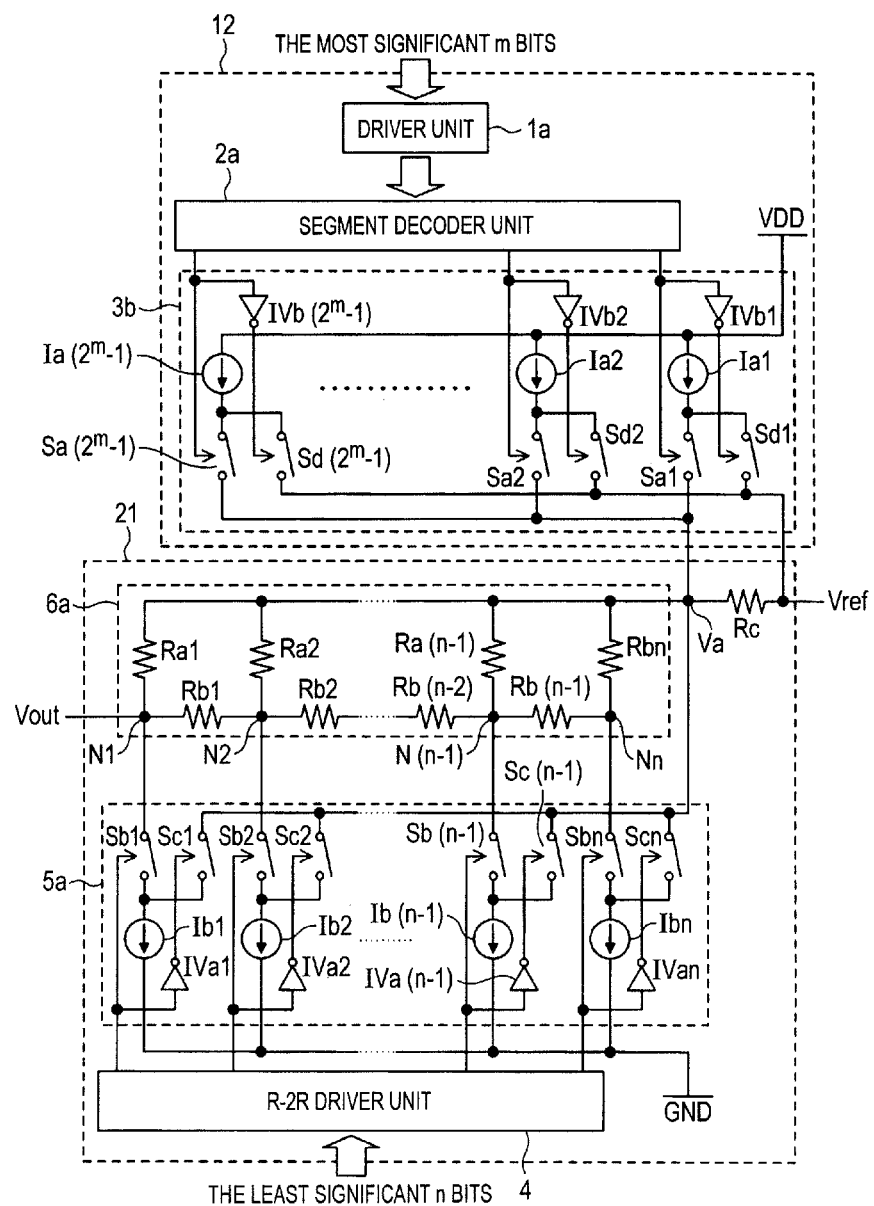
FIG. 4 is a circuit block diagram showing a configuration of a DA converter according to a second embodiment.

Next, a DA converter according to a second embodiment will be described. FIG. 4 is a circuit block diagram showing a configuration of a DA converter 200 according to the second embodiment. The DA converter 200 is a modified DA converter 100 of the first embodiment in which the segment type DA converter 11 is replaced by a segment type DA converter 12.

The segment type DA converter 12 is a modified segment type DA converter 11 in which the constant current cell unit 3a is replaced by a constant current cell unit 3b. The constant current cell unit 3b is a modified constant current cell unit 3a of the DA converter 100 to which switches Sd1 to Sd($2^m-1$) and inverters IVb1 to IVb($2^m-1$) are added.

In the constant current cell unit 3b, a switch Sdk (k is an integer satisfying $1 \leq k \leq 2^m-1$) is coupled between the negative terminal of a constant current source Iak and the reference voltage Vref. An inverted signal of a corresponding output signal of the segment decoder unit 2a is inputted into the control terminal of the switch Sdk via the inverter IVbk. The other configuration of the DA converter 200 is the same as that of the DA converter 100, so the description is omitted.

Next, an operation of the DA converter 200 will be described. In the constant current cell unit 3a, when the switch Sak is turned off, the switch Sdk is turned on. In this case, a current flows from the constant current source Iak to the reference voltage Vref. On the other hand, when the switch Sak is turned on, the switch Sdk is turned off. In this case, a current flows from the constant current source Iak to the node Va.

Therefore, the constant current cell unit 3b always outputs a current having a value of $(2^m-1)$I. On the other hand, in the same manner as in the first embodiment, the constant current cell unit 5b outputs a current having a value of nI. In other words, in the DA converter 200, a current having a current value (β-n)I always flows from the reference voltage Vref to the node Va in the resistance Rc. In this case, even when there is a parasitic resistance between the reference voltage source (not shown in FIG. 4) that generates the reference voltage Vref and the resistance Rc, the value of the current $(\beta-n)I$ flowing in the resistance Rc is constant, so it is possible to prevent the reference voltage Vref from fluctuating. Therefore, according to the present configuration, it is possible to output a stable output voltage by preventing the reference voltage Vref from fluctuating. In other words, the DA converter 200 can generate an output voltage whose fluctuation amplitude is constant.

Third Embodiment

Figure 5:
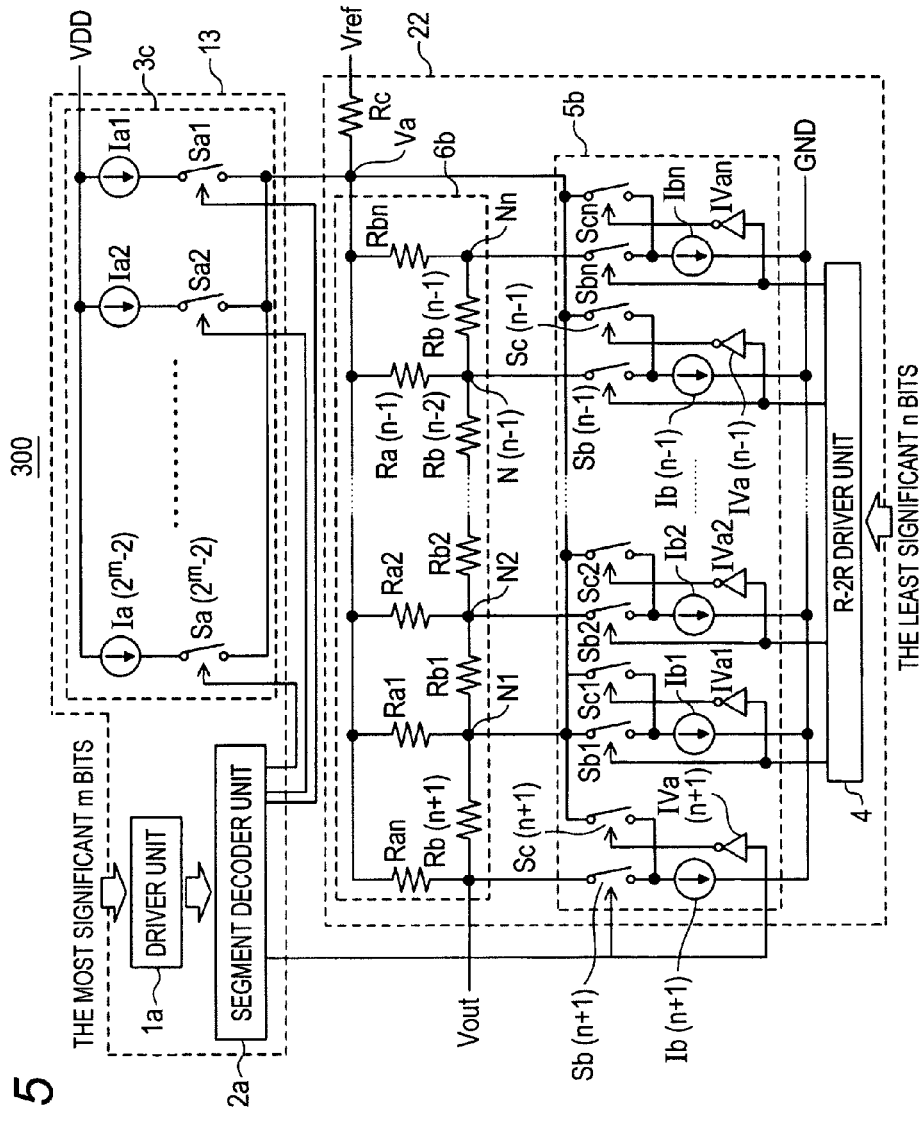
FIG. 5 is a circuit block diagram showing a configuration of a DA converter according to a third embodiment.

Next, a DA converter according to a third embodiment will be described. FIG. 5 is a circuit block diagram showing a configuration of a DA converter 300 according to the third embodiment. The DA converter 300 is a modified DA converter 100 of the first embodiment in which the segment type DA converter 11 and the R-2R resistance ladder DA converter 21 are respectively replaced by a segment type DA converter 13 and an R-2R resistance ladder DA converter 22.

The segment type DA converter 13 is a modified segment type DA converter 11 in which the constant current cell unit 3a is replaced by a constant current cell unit 3c. The constant current cell unit 3c is a modified constant current cell unit 3a from which the constant current source $Ia(2^m-1)$ and the switch $Sa(2^m-1)$ are deleted. Among the $(2^m-1)$ decode signals generated by the segment decoder unit 2a, $(2^m-2)$ decode signals are inputted into the constant current cell unit 3c. The decode signal other than the decode signals inputted into the constant current cell unit 3c is inputted into the R-2R resistance ladder DA converter 22.

The R-2R resistance ladder DA converter 22 is a modified R-2R resistance ladder DA converter 21 in which the constant current cell unit 5a and the R-2R resistance ladder 6a are respectively replaced by a constant current cell unit 5c and the R-2R resistance ladder 6b.

The constant current cell unit 5b is a modified constant current cell unit 5a of the R-2R resistance ladder DA converter 21 to which a constant current source Ib(n+1), a switch Sb(n+1), a switch Sc(n+1), and an inverter IVa(n+1) are added. The positive terminal of the constant current source Ib(n+1) is coupled to the output voltage Vout via the switch Sb(n+1). The positive terminal of the constant current source Ib(n+1) is also coupled to the node Va via the switch Sc(n+1). The negative terminal of the constant current source Ib(n+1) is coupled to the ground voltage GND. A corresponding decode signal from the segment decoder unit 2a is inputted into the control terminal of the switch Sb(n+1). An inverted signal of a corresponding decode signal from the segment decoder unit 2a is inputted into the control terminal of the switch Sc(n+1).

The R-2R resistance ladder DA converter 22 is a modified R-2R resistance ladder DA converter 21 in which the constant current cell unit 5a is replaced by the constant current cell unit 5c and further the R-2R resistance ladder 6a is replaced by the R-2R resistance ladder 6b. The R-2R resistance ladder 6b is a modified R-2R resistance ladder 6a to which a resistance Ran and a resistance Rb(n+1) are added on the side of the output voltage Vout. The resistance value of the resistance Ran is 2R. The resistance value of the resistances Rb(n+1) is R. Therefore, in the same way in the R-2R resistance ladder 6a, a combined resistance value between the node Va and the output terminal of the R-2R resistance ladder 6b is R.

In other words, it can be said that the DA converter 300 is a modified DA converter 100 in which one of the constant current sources in the segment type DA converter is moved into the R-2R resistance ladder DA converter.

Next, an operation of the DA converter 300 will be described. In the description below, as an example, a case in which the DA converter 300 is an 8-bit DA converter will be described. Hereinafter, the 8-bit DA converter 300 is referred to as a DA converter 301. Here, among the 7 decode signals generated by decoding the upper 3 bits (m=3), 6 decode signals are inputted into the segment type DA converter 13. The lower 5 bits (n=5) and one decode signal other than those inputted into the segment type DA converter 13 are inputted into the R-2R resistance ladder DA converter 22.

In this case, the voltage at the node Va is determined by a current value obtained by adding an output current $\beta I$ of the constant current cell unit 3c to an output current $(n+1)I$ of the constant current cell unit 5b. Here, $\beta$ is an integer from 0 to 6 ($=2^m-2$). In this case, the voltage Va is represented by the following formula (4):

$$Va = Vref + \{\beta - (n+1)\} \times I \times 2R \quad (4)$$

The output voltage Vout outputted from the DA converter 300 is represented by the following formula (5). Here, α is the same as that in the formula (2):

$$Vout = Va - \frac{1}{2^n} \times \alpha \times I \times 2R \quad (5)$$

Next, the current flow in the DA converter 301 will be described. The output current $\beta I$ of the constant current sources Ia1 to $Ia(2^m-2)$ of the constant current cell unit 3c flows into the node Va. The output current $\beta I$ varies in a range from 0 to 6I according to variation of data of the upper 3 bits. A current $(n+1)I$ flows from the node Va to the constant current cell unit 5b. Since n is 5, the current value of the output current $(n+1)I$ is always 6I and constant.

When the output current $\beta I$ is 6I, an equilibrium state is generated, and no current flows in the resistance Rc. When the output current $\beta I$ is larger than 6I, a current having a current value $(\beta-6)I$ flows from the node Va to the reference voltage Vref in the resistance Rc. On the other hand, when the output current $\beta I$ is smaller than the output current 6I, a current having a current value $(6-\beta)I$ flows from the reference voltage Vref to the node Va in the resistance Rc. Therefore, the maximum current that flows in the DA converter 300 is 6I.

Therefore, in the DA converter 301, the maximum current consumption can be reduced to 6I. Thus, according to the present configuration, it is possible to further reduce the current consumption compared with the DA converter 101 according to the first embodiment.

Figure 6:
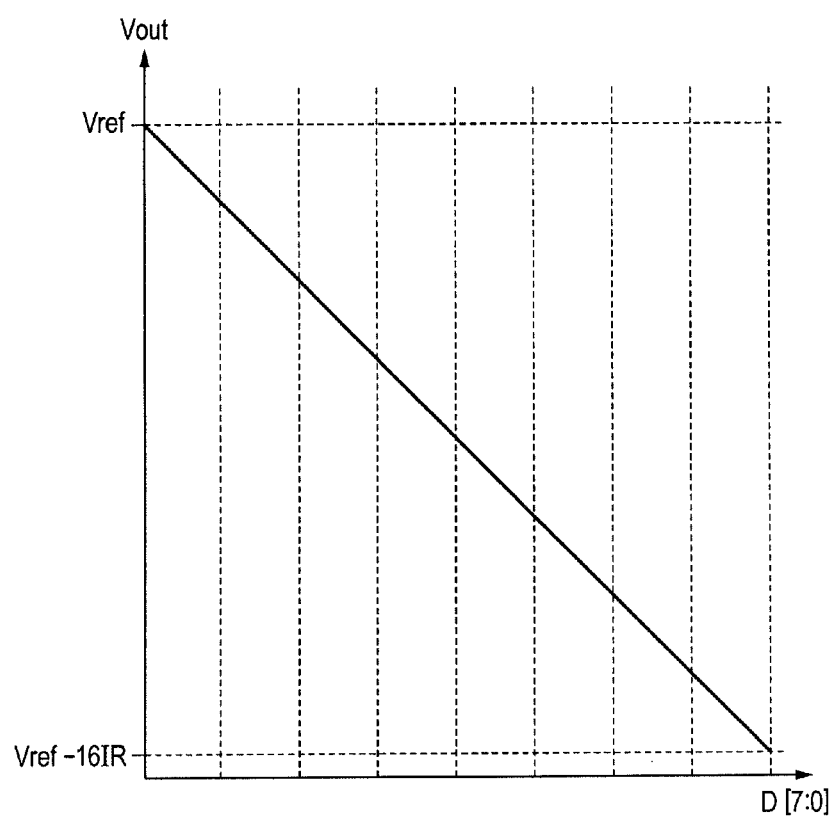
FIG. 6 is a graph showing an output voltage Vout of a DA converter according to the third embodiment.

FIG. 6 is a graph showing an output voltage Vout of the DA converter 301. In FIG. 6, the horizontal axis indicates 8-bit code and the vertical axis indicates the value of the output voltage Vout. The DA converter 301 outputs 256 steps (8 bits) of output voltages in a range shown by the following formula (6):

$$Vref \leq Vout \leq Vref - 16IR \quad (6)$$

In the DA converter 300, a part of the constant current sources in the segment type DA converter is moved into the R-2R resistance ladder DA converter. At this time, the number of constant current sources that can be moved is not limited to one, but multiple constant current sources can be moved. However, in order to minimize the current consumption in the entire DA converter, it is desired that the number of the constant current sources included in the segment type DA converter is the same as the number of the constant current sources included in the R-2R resistance ladder DA converter. Specifically, when the number of the constant current sources moved from the segment type DA converter to the R-2R resistance ladder DA converter is p, p is desired to be an integer of 1 or more satisfying $p=(2^m-n-1)/2$. In this case, among $(2^m-1)$ decode signals generated by decoding the upper m bits, $(2^m-1-p)$ decode signals are inputted into the segment type DA converter 13. The lower n bits and p decode signals other than those inputted into the segment type DA converter 13 are inputted into the R-2R resistance ladder DA converter 22.

Fourth Embodiment

Figure 7:
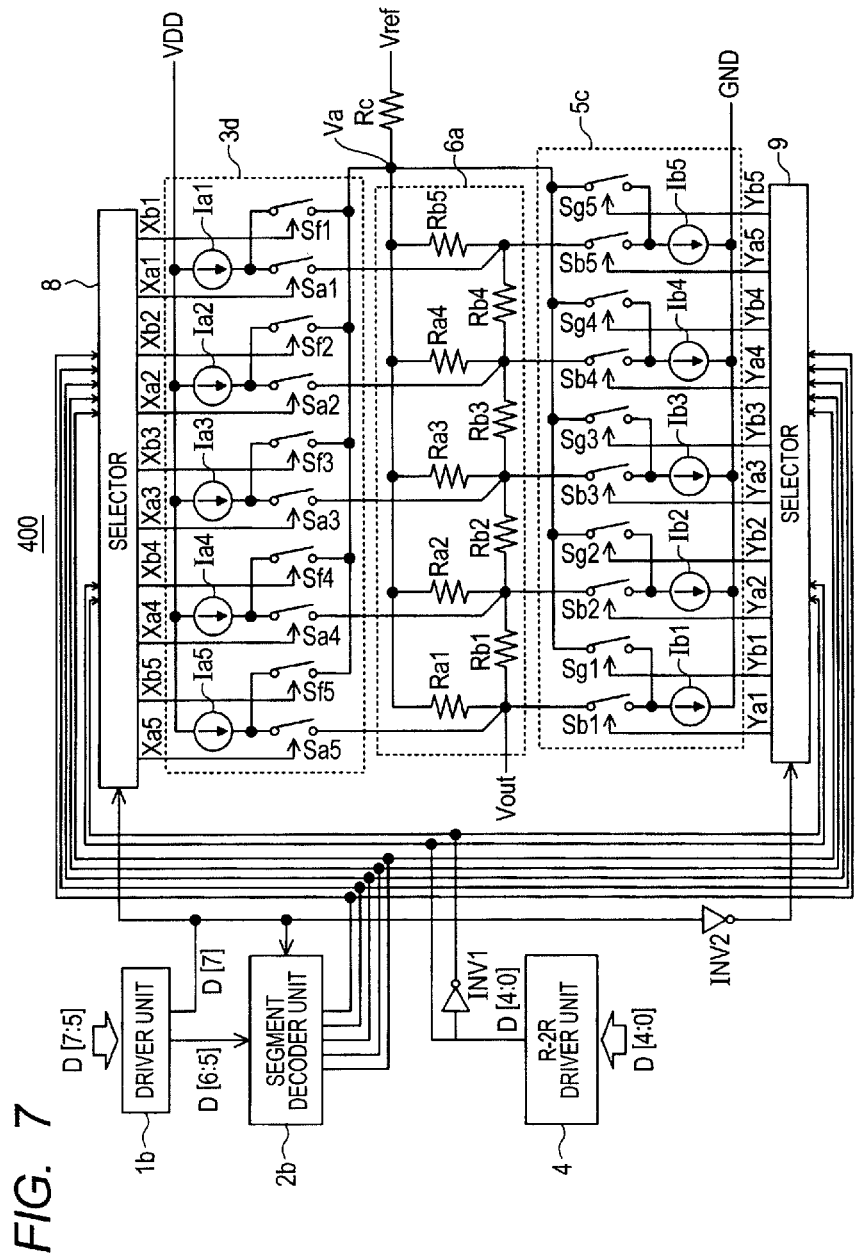
FIG. 7 is a circuit block diagram showing a configuration of a DA converter according to a fourth embodiment.

Next, a DA converter according to a fourth embodiment will be described. FIG. 7 is a circuit block diagram showing a configuration of a DA converter 400 according to the fourth embodiment. As shown in FIG. 7, the DA converter 400 includes a driver unit 1b, a segment decoder unit 2b, a constant current cell unit 3d, an R-2R driver unit 4, a constant current cell unit 5c, an R-2R resistance ladder 6a, a resistance Rc, and selectors 8 and 9. In the present embodiment, to simplify the description, a case in which 8-bit digital signal is inputted into the DA converter 400 will be described. In this case, an 8-bit digital signal is divided into the upper 3 bits D[7 to 5] and the lower 5 bits D[4 to 0], and inputted into the DA converter 400. However, the digital signal inputted into the DA converter 400 is not limited to an 8-bit signal. In the same way as in the first to the third embodiments, a digital signal of (m+n) bits can be inputted into the DA converter 400. The R-2R driver unit 4 and the R-2R resistance ladder 6a of the DA converter 400 are the same as those of the DA converter 100 according to the first embodiment, so the description is omitted.

The upper 3 bits D[7 to 5] is inputted into the driver unit 1b. The driver unit 1b divides the inputted upper 3 bits D[7 to 5] into the most significant bit D[7] and the other upper bits D[6 and 5] and outputs them.

The most significant bit D[7] and the other upper bits D[6 and 5] are inputted into the segment decoder unit 2b from the driver unit 1b. The segment decoder unit 2b decodes the other upper bits D[6 and 5] according to the most significant bit D[7]. The signals decoded in the segment decoder unit 2b are outputted to the selectors 8 and 9 as output signals.

The most significant bit D[7], the lower 5 bits [4 to 0], and the output signals of the segment decoder unit 2b are inputted into the selector 8. Further, an inverted signal of the lower 5 bits [4 to 0] is inputted into the selector 8 via the inverter INV1. The selector 8 outputs output signals Xa1 to Xa5 and Xb1 to Xb5 according to the most significant bit D[7].

The lower 5 bits [4 to 0] and the output signals of the segment decoder unit 2b are inputted into the selector 9. Further, an inverted signal of the lower 5 bits [4 to 0] is inputted into the selector 9 via the inverter INV1. Furthermore, an inverted signal of the most significant bit D[7] is inputted into the selector 9 via the inverter INV2. The selector 9 outputs output signals Ya1 to Ya5 and Yb1 to Yb5 according to the inverted signal of the most significant bit D[7] (in other words, according to the most significant bit D[7]).

The constant current cell unit 3d includes constant current sources Ia1 to Ia5, switches Sa1 to Sa5, and switches Sf1 to Sf5. The constant current cell unit 5c includes constant current sources Ib1 to Ib5, switches Sb1 to Sb5, and switches Sg1 to Sg5.

A constant current source Iah (h is an integer satisfying $1 \leq h \leq 5$), a switch Sah, a switch Sbh, and a constant current source Ibh are coupled in series in this order between the power source voltage VDD and the ground voltage GND. The switch Sah and the switch Sbh are coupled to each other via a corresponding node Nh of the R-2R resistance ladder 6a. The negative terminal of the constant current source Iah is coupled to the node Va via the switch Sfh. The positive terminal of the constant current source Ibh is coupled to the node Va via the switch Sgh.

An output signal Xah is inputted into the control terminal of the switch Sah. An output signal Xbh is inputted into the control terminal of the switch Sfh. An output signal Yah is inputted into the control terminal of the switch Sbh. An output signal Ybh is inputted into the control terminal of the switch Sgh.

Next, the operation of the DA converter 400 will be described. The operation of the DA converter 400 is controlled by the most significant bit D[7]. FIG. 8 is an operation table showing the operation of the DA converter 400.

The operation of the segment decoder unit 2b is controlled by the most significant bit D[7]. First, the operation when the most significant bit D[7] is "0" will be described. In this case, when the other upper bits D[6 and 5] are [00], the segment decoder unit 2b outputs [00011]. When the other upper bits D[6 and 5] are [01], the segment decoder unit 2b outputs [00111]. When the other upper bits D[6 and 5] are [10], the segment decoder unit 2b outputs [01111]. When the other upper bits D[6 and 5] are [11], the segment decoder unit 2b outputs [11111].

Next, the operation when the most significant bit D[7] is "1" will be described. In this case, when the other upper bits D[6 and 5] are [00], the segment decoder unit 2b outputs [11111]. When the other upper bits D[6 and 5] are [01], the segment decoder unit 2b outputs [01111]. When the other upper bits D[6 and 5] are [10], the segment decoder unit 2b outputs [00111]. When the other upper bits D[6 and 5] are [11], the segment decoder unit 2b outputs [00011].

In summary, signals corresponding to the other upper bits [6 and 5] outputted by the segment decoder unit 2b are inverted when the most significant bit D[7] is inverted.

Next, the operation of the selector 8 will be described. The operation of the selector 8 is controlled by the most significant bit D[7]. When the most significant bit D[7] is "0", the selector 8 outputs the output data of the segment decoder unit 2b as the output signals Xb1 to Xb5. The selector 8 also outputs the output signals Xa1 to Xa5 as signals to turn off the switches Sa1 to Sa5. Thus, in this case, the number of the constant current sources that are turned on in the constant current cell unit 3d is controlled by the output data of the segment decoder unit 2b. Therefore, the constant current cell unit 3d functions as a constant current cell unit of the segment type DA converter.

On the other hand, when the most significant bit D[7] is "1", the selector 8 outputs the output data of the R-2R driver unit 4 as the output signals Xa1 to Xa5. The selector 8 also outputs the inverted data of the output data of the R-2R driver unit 4 as the output signals Xb1 to Xb5. Thus, in this case, the coupling relationship between the constant current cell unit 3d and the R-2R resistance ladder 6a is controlled by the output data of the R-2R driver unit 4. Therefore, the constant current cell unit 3d functions as a constant current cell unit of the R-2R resistance ladder DA converter.

Next, the operation of the selector 9 will be described. The inverted signal of the most significant bit D[7] is inputted into the selector 9. Therefore, the selector 9 operates complementarily with the selector 8. When the most significant bit D[7] is "1", the selector 9 outputs the output data of the segment decoder unit 2b as the output signals Yb1 to Yb5. The selector 9 also outputs the output signals Ya1 to Ya5 as signals to turn off the switches Sb1 to Sb5. Thus, in this case, the number of the constant current sources that are turned on in the constant current cell unit 5c is controlled by the output data of the segment decoder unit 2b. Therefore, the constant current cell unit 5c functions as a constant current cell unit of the segment type DA converter.

On the other hand, when the most significant bit D[7] is "0", the selector 9 outputs the output data of the R-2R driver unit 4 as the output signals Ya1 to Ya5. The selector 9 also outputs the inverted data of the output data of the R-2R driver unit 4 as the output signals Yb1 to Yb5. Thus, in this case, the coupling relationship between the constant current cell unit 5c and the R-2R resistance ladder 6a is controlled by the output data of the R-2R driver unit 4. Therefore, the constant current cell unit 5c functions as a constant current cell unit of the R-2R resistance ladder DA converter.

Therefore, in the DA converter 400, when the most significant bit D[7] is "0", the constant current cell unit 3d functions as a constant current cell unit of the segment type DA converter, and the constant current cell unit 5c functions as a constant current cell unit of the R-2R resistance ladder DA converter. On the other hand, when the most significant bit D[7] is "1", the constant current cell unit 3d functions as a constant current cell unit of the R-2R resistance ladder DA converter, and the constant current cell unit 5c functions as a constant current cell unit of the segment type DA converter.

In this way, the DA converter 400 can replace the segment type DA converter with the R-2R resistance ladder DA converter and vice versa in their coupling relationships on the basis of the most significant bit.

In the DA converter 400, when the most significant bit D[7] is "0", as the other upper bits D[6 and 5] changes from [00] to [01] to [10] to [11], the number of the constant current sources that are turned on in the constant current cell unit 3d changes from 2 to 3 to 4 to 5. On the other hand, when the most significant bit D[7] is "1", as the other upper bits D[6 and 5] changes from [00] to [01] to [10] to [11], the number of the constant current sources that are turned on in the constant current cell unit 5c changes from 5 to 4 to 3 to 2.

Thereby, when the most significant bit D[7] is "0", the voltage Va at the node Va of the DA converter 400 is determined by a current value obtained by adding the output current βI of the constant current cell unit 3d to the output current nI of the constant current cell unit 5c and the R-2R resistance ladder 6a. Here, the number of the upper bits is m, and the number of the lower bits is n. β is an integer from {n-($2^{m-1}$-1)} to n. The voltage Va at this time is represented by the following formula (7):

$$Va = Vref + (\beta - n) \times I \times 2R \quad (7)$$

Here, α is an integer from 0 to ($2^n$-1).

In this case, the output voltage Vout outputted from the DA converter 400 is represented by the following formula (8):

$$Vout = Va - \frac{1}{2^n} \times \alpha \times I \times 2R \quad (8)$$

When the most significant bit D[7] is "1", the voltage Va at the node Va of the DA converter 400 is determined by a current value obtained by adding the output current βI of the constant current cell unit 5c to the output current nI of the constant current cell unit 3d and the R-2R resistance ladder 6a. The voltage Va at this time is represented by the following formula (9):

$$Va = Vref + (n - \beta) \times I \times 2R \quad (9)$$

In this case, the output voltage Vout outputted from the DA converter 400 is represented by the following formula (10):

$$Vout = Va - \frac{1}{2^n} \times \alpha \times I \times 2R \quad (10)$$

Figure 9:
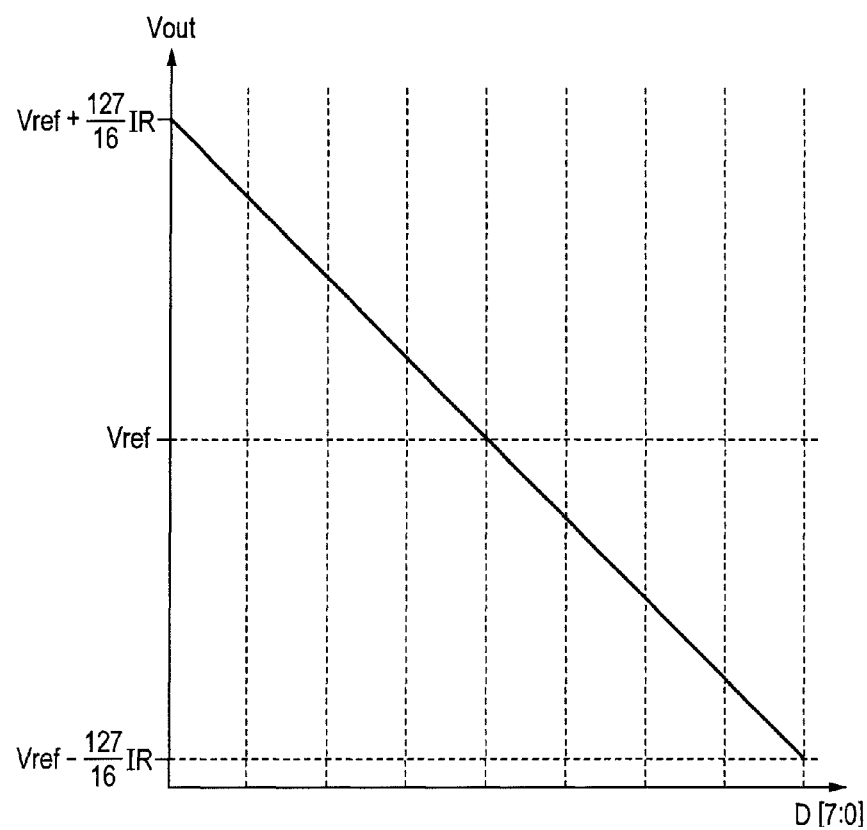
FIG. 9 is a graph showing an output voltage Vout of the DA converter according to the fourth embodiment.
Figure 10:
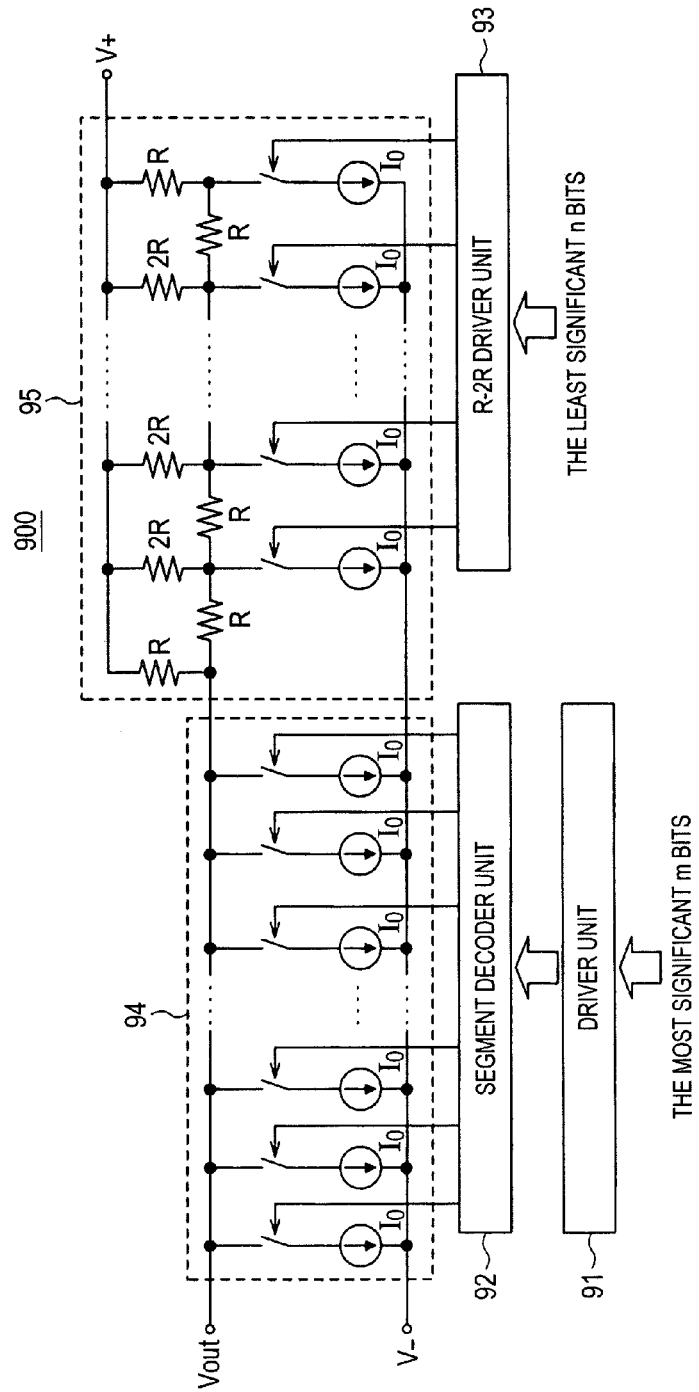
FIG. 10 is a circuit block diagram showing a configuration of an eclectic DA converter according to a fourth embodiment.

Since digital signals of the upper 3 bits and the lower 5 bits are inputted into the DA converter 400, m is 3 and n is 5 in the above formula. FIG. 9 is a graph showing an output voltage Vout of the DA converter 400. In FIG. 9, the horizontal axis indicates 8-bit code and the vertical axis indicates the value of the output voltage Vout. The DA converter 400 outputs an 8-bit voltage in a range shown by the following formula (11):

$$Vref - \frac{127}{16} IR \le Vout \le Vref + \frac{127}{16} IR \quad (11)$$

Next, the current flow in the DA converter 400 will be described. When one of the constant current cell unit 3d and the constant current cell unit 5c functions as a segment type DA converter, as shown in FIG. 8, a current having a value of 2I to 5I flows in the constant current cell unit 3d or the constant current cell unit 5c. When one of the constant current cell unit 3d and the constant current cell unit 5c functions as an R-2R resistance ladder DA converter, a current having a value of 5I flows in the constant current cell unit 3d or the constant current cell unit 5c. Therefore, the maximum value of the current that flows in the constant current cell unit 3d and the constant current cell unit 5c of the DA converter 400 is 5I.

In further generalization, when one of the constant current cell unit 3d and the constant current cell unit 5c functions as a segment type DA converter, a current having a value from {n-($2^{m-1}$-1)}I to nI flows in the constant current cell unit 3d or the constant current cell unit 5c. When one of the constant current cell unit 3d and the constant current cell unit 5c functions as an R-2R resistance ladder DA converter, a current having a value of nI flows in the constant current cell unit 3d or the constant current cell unit 5c. Therefore, the maximum value of the current that flows in the constant current cell unit 3d and the constant current cell unit 5c is nI.

Therefore, in the DA converter 400, the maximum current consumption can be reduced to nI. Thus, according to the present configuration, it is possible to further reduce the current consumption compared with the DA converters 100, 200, and 300.

Here, the number of bits of a signal provided to a constant current cell unit that functions as the segment type DA converter is assumed to be N (N is an integer of 1 or more). The number of bits of a signal provided to a constant current cell unit that functions as the R-2R resistance ladder DA converter is assumed to be M (M is an integer of 1 or more). The number of bits of a digital signal provided to the DA converter 400 is assumed to be K (K=1+M+N). In this case, the number of constant current sources required for the constant current cell unit that functions as the segment type DA converter is $2^N$-1. The number of constant current sources required for the constant current cell unit that functions as the R-2R resistance ladder DA converter is M. In this case, it is required to satisfy M≧$2^N$-1 for the DA converter 400 to function as a DA converter.

The present invention is not limited to the above-described embodiments, but may be appropriately modified without departing from the scope of the invention. For example, in the DA converter 300 according to the third embodiment, the constant current sources of the constant current cell unit 3c can be coupled to the terminal of the resistance Rc on the side of the reference voltage Vref. Thereby, in the same manner as the DA converter 200 according to the second embodiment, the DA converter 300 can generate an output voltage whose fluctuation amplitude is constant.

In the DA converter 400 according to the fourth embodiment, the constant current sources of one of the constant current cell unit 3d and the constant current cell unit 5c, which functions as the segment type DA converter, can be coupled to the terminal of the resistance Rc on the side of the reference voltage Vref. Thereby, in the same manner as the DA converter 200 according to the second embodiment, the DA converter 400 can generate an output voltage whose fluctuation amplitude is constant. Further, in the DA converter 400 according to the fourth embodiment, the replacement of the segment type DA converter with the R-2R resistance ladder DA converter and vice versa can be performed based on any bit other than the most significant bit.

The resistance value of the resistance Rc of the above embodiments is not limited to 2R. The resistance value of the resistance Rc may be two times the combined resistance value of the R-2R resistance ladder circuit. The resistance value of the resistance Ra1 of the R-2R resistance ladder 6a or the resistance Ra(n+1) of the R-2R resistance ladder 6b may be R. In this case, the combined resistance value of the R-2R resistance ladder is $(2/3)R$. Therefore, the resistance value of the resistance Rc may be $(4/3)R$.

The current value of the constant current sources included in a segment type DA converter is not limited to I, but may be a value different from the current value of the constant current sources included in an R-2R resistance ladder DA converter. For example, the current value of the constant current sources included in a segment type DA converter can be xI (x is an arbitrary positive value). In this case, the resistance value of the resistance Rc may be 1/x. In other words, it is only required that a value obtained by multiplying the current value of the constant current sources included in a segment type DA converter by the resistance value of the resistance Rc is a constant value. Thereby, the same function as that of the above described DA converters 100, 101, 200, 300, and 400 can be realized.

Although, in the above embodiments, the R-2R resistance ladder 6a or 6b is used, another resistance ladder can be used. For example, a resistance ladder can be used in which the resistance Ra1 to Ran of the R-2R resistance ladder 6a or the resistances Ra1 to Ra(n+1) of the R-2R resistance ladder 6b are replaced by resistances having a resistance value of R.

What is claimed is:

1. A DA converter comprising:
a first DA conversion unit that is coupled to a first voltage source and outputs a current signal changing in a stepwise manner according to an inputted first digital signal; and
a second DA conversion unit that is coupled to the first DA conversion unit in series between a second voltage source different from the first voltage source and the first voltage source and outputs an output voltage changing in a stepwise manner,
wherein the second DA conversion unit changes the output voltage by raising or lowering a reference voltage supplied from a reference voltage source coupled to the second DA conversion unit according to an inputted second digital signal and the current signal.

2. The DA converter according to claim 1, which changes the output voltage in $2^{(m+n)}$ steps according to the first digital signal of m bits (m is an integer of 2 or more) and the second digital signal of n bits (n is an integer of 2 or more).

3. The DA converter according to claim 2,
wherein the first DA conversion unit includes $(2^m-1)$ first constant current sources and changes the current signal by controlling each of the $(2^m-1)$ first constant current sources according to $(2^m-1)$ decode signals generated by decoding the first digital signal of m bits.

4. The DA converter according to claim 2,
wherein the second DA conversion unit includes:
a resistance ladder circuit that is coupled to the first DA conversion unit via a first node and outputs the output voltage from an output terminal; and
n second constant current sources that are coupled between the resistance ladder circuit and the second voltage source according to the second digital signal of n bits, and
wherein the second DA conversion unit changes the output voltage by changing combination of the second constant current sources coupled to the resistance ladder circuit.

5. The DA converter according to claim 4,
wherein the second constant current sources that are not coupled to the resistance ladder circuit among the n second constant current sources are coupled between the first node and the second voltage source, and
wherein each of the n second constant current sources constantly outputs current.

6. The DA converter according to claim 5,
wherein the second DA conversion unit further includes a first resistance coupled to the reference voltage source, and
wherein the second DA conversion unit discharges a differential current between the output current from the n second constant current sources and the current signal to the reference voltage source via the first resistance, or the differential current is supplied to the second DA conversion unit from the reference voltage source via the first resistance.

7. The DA converter according to claim 6,
wherein the first constant current sources output current having a value different from a value of current outputted from the second constant current sources, and
wherein a resistance value of the first resistance is set so that a value obtained by multiplying a value of current outputted from the first constant current sources by the resistance value of the first resistance is constant.

8. The DA converter according to claim 4,
wherein the first constant current sources output current having the same value as that of current outputted from the second constant current sources.

9. The DA converter according to claim 4,
wherein the resistance ladder circuit includes n second resistances coupled in series between the first node and the output terminal, and (n−1) resistances coupled between the first node and output terminal side terminals of the second resistances other than the second resistance whose one end is coupled to the first node, and
wherein the n second constant current sources are respectively coupled to the output terminal side terminals of the n second resistances or coupled to the first node.

10. The DA converter according to claim 9,
wherein the (n−1) resistances includes a third resistance coupled between the output terminal and the first node and (n−2) fourth resistances other than the third resistance.

11. The DA converter according to claim 10,
wherein the resistance value of the third resistance is the same as the resistance value of the fourth resistances and two times the resistance value of the second resistances.

12. The DA converter according to claim 11,
wherein the resistance value of the first resistance is two times the combined resistance value between the first node and the output terminal of the resistance ladder circuit.

13. The DA converter according to claim 10,
wherein the resistance value of the third resistance is the same as the resistance value of the second resistances, and
wherein the resistance value of the fourth resistances is two times the resistance value of the third resistance.

14. The DA converter according to claim 4,
wherein the first constant current sources supply current to the reference voltage source side terminal of the first node or the first resistance.

15. The DA converter according to claim 2,
wherein the first DA conversion unit includes ($2^m-1-p$ (p is an integer of 1 or more) first constant current sources and changes the current signal by controlling each of the ($2^m-1-p$) first constant current sources according to ($2^m-1-p$) decode signals among ($2^m-1$) decode signals generated by decoding the first digital signal of m bits.

16. The DA converter according to claim 15,
wherein the second DA conversion unit includes:
a resistance ladder circuit that is coupled to the first DA conversion unit via a first node and outputs the output voltage from an output terminal;
n second constant current sources that are coupled between the resistance ladder circuit and the second voltage source according to the second digital signal of n bits; and
p third constant current sources that are coupled between the resistance ladder circuit and the second voltage source according to the p decode signals other than the ($2^m-1-p$) decode signals, and
wherein the second DA conversion unit changes the output voltage by changing combination of the second and the third constant current sources coupled to the resistance ladder circuit.

17. The DA converter according to claim 15,
wherein p is an integer of 1 or more satisfying $p=(2^m-n-1)/2$.

18. The DA converter according to claim 2,
wherein the first digital signal of m bits is a signal including the upper m bits of a digital signal of (m+n) bits, and
wherein the second digital signal of n bits is a signal including the lower n bits of the digital signal of (m+n) bits.

19. A DA converter comprising:
a first constant current cell unit including a plurality of first constant current sources;
a second constant current cell unit which is coupled to the first constant current cell unit in series via a first node and includes a plurality of second constant current sources, the number of which is the same as that of the first constant current sources; and
a resistance circuit which is coupled between the first node and an output terminal and outputs an output voltage changing in a stepwise manner according to a flowing current and a voltage of the first node from the output terminal,
wherein, when the value of the most significant bit of an inputted digital signal is a first value, the first constant current cell unit changes an output current in a stepwise manner by controlling the number of the first constant current sources that output current according to q (q is an integer of 1 or more) bits excluding the most significant bit included in the digital signal, and the second constant current cell unit couples the second constant current sources to the first node either directly or via the resistance circuit according to r (r is an integer of 2 or more) bits excluding the most significant bit and the q bits included in the digital signal,
wherein, when the value of the most significant bit is a second value different from the first value, the second constant current cell unit changes an output current in a stepwise manner by controlling the number of the second constant current sources that output current according to the q bits, and the first constant current cell unit couples the first constant current sources to the first node either directly or via the resistance circuit according to the r bits included in the digital signal,
wherein the voltage of the first node changes in a stepwise manner according to the change of the output current of the first constant current cell unit or the output current of the second constant current cell unit, and
wherein the resistance circuit changes the output voltage by raising or lowering the voltage of the first node according to a combination of the first constant current sources or the second constant current sources coupled to the resistance circuit.

* * * * *